United States Patent
Kubo

(10) Patent No.: US 10,490,865 B2
(45) Date of Patent: Nov. 26, 2019

(54) ABNORMALITY DETERMINATION APPARATUS

(71) Applicant: DENSO CORPORATION, Kariya, Aichi-pref. (JP)

(72) Inventor: Shunichi Kubo, Kariya (JP)

(73) Assignee: DENSO CORPORATION, Kariya (JP)

( * ) Notice: Subject to any disclaimer, the term of this patent is extended or adjusted under 35 U.S.C. 154(b) by 3 days.

(21) Appl. No.: 15/331,370

(22) Filed: Oct. 21, 2016

(65) Prior Publication Data
US 2017/0117596 A1    Apr. 27, 2017

(30) Foreign Application Priority Data
Oct. 21, 2015   (JP) ................................. 2015-207172

(51) Int. Cl.
*H01M 10/48*   (2006.01)
*G01R 31/396*  (2019.01)
(Continued)

(52) U.S. Cl.
CPC .......... *H01M 10/482* (2013.01); *G01R 31/04* (2013.01); *G01R 31/396* (2019.01);
(Continued)

(58) Field of Classification Search
CPC ............ G01R 31/3658; H01M 10/425; H01M 10/4285; H01M 10/482; H01M 2220/20
See application file for complete search history.

(56) References Cited

U.S. PATENT DOCUMENTS

| 2008/0252266 A1* | 10/2008 | Bolz ................ G01R 31/3658 320/166 |
| 2009/0179650 A1* | 7/2009 | Omagari ............ G01R 31/3624 324/433 |

(Continued)

FOREIGN PATENT DOCUMENTS

| JP | 2014-183671 A | 9/2014 |
| JP | 2015-083960 A | 4/2015 |

OTHER PUBLICATIONS

Saltzman, R, www.startribune.com, "Buying a house with a fuse panel? Here's what you should know", Oct. 13, 2011. (Year: 2011).*

*Primary Examiner* — Jonathan G Leong
*Assistant Examiner* — Victoria H Lynch
(74) *Attorney, Agent, or Firm* — Oliff PLC

(57) ABSTRACT

An abnormality determination apparatus is applied to a battery pack including blocks composed of battery cells connected in series, and a connecting member that connect blocks to one another in series. In the blocks and the connecting member, a first detection circuit detects a voltage of a first series circuit including the connecting member. A closed-circuit forming unit forms a closed circuit so as to allow a current to flow to the connecting member. The closed circuit includes the connecting member, at least one of the battery cells, and a diode connected in parallel to connecting member. When a charge-discharge current is not flowing to the battery pack, a first abnormality determining unit determines whether or not an open abnormality has occurred in the connecting member, based on a detection value from the first detection circuit in a state in which the closed-circuit forming unit is forming the closed circuit.

7 Claims, 3 Drawing Sheets

(51) Int. Cl.
*H01M 10/42* (2006.01)
*G01R 31/04* (2006.01)
(52) U.S. Cl.
CPC ..... *H01M 10/425* (2013.01); *H01M 10/4285* (2013.01); *H01M 2220/20* (2013.01)

(56) References Cited

U.S. PATENT DOCUMENTS

| | | | |
|---|---|---|---|
| 2011/0149454 A1* | 6/2011 | Shibuya | H01M 2/34 361/87 |
| 2014/0167778 A1 | 6/2014 | Todani et al. | |
| 2014/0232413 A1 | 8/2014 | Kitahara et al. | |

* cited by examiner

ABNORMALITY DETERMINATION APPARATUS

CROSS-REFERENCE TO RELATED APPLICATION

This application is based on and claims the benefit of priority from Japanese Patent Application No. 2015-207172, filed Oct. 21, 2015. The entire disclosure of the above application is incorporated herein by reference.

BACKGROUND

Technical Field

The present disclosure relates to an abnormality determination apparatus that is applied to a battery pack, and includes a plurality of blocks composed of a plurality of battery cells connected in series, and a connecting member that connects the blocks to one another in series.

Related Art

An abnormality determination apparatus is used in a battery pack that includes a plurality of blocks composed of a plurality of battery cells connected in series and a connecting member that connects the blocks to one another in series. The abnormality determination apparatus determines the occurrence of an open abnormality in the connecting member, in which conduction between the blocks is interrupted (JP-A-2015-83960).

In the configuration disclosed in JP-A-2015-83960, new switching elements and resistor elements are required to be added. In addition, charge-discharge control of a flying capacitor is also required. Therefore, the configuration is complex.

SUMMARY

It is thus desired to simplify a configuration of an abnormality determination apparatus that determines an occurrence of an open abnormality in a connecting member in which conduction between blocks configuring a battery pack is interrupted.

An exemplary embodiment of the present disclosure provides an abnormality determination apparatus that is applied to a battery pack including a plurality of blocks, each block being composed of a plurality of battery cells that are connected in series, and a connecting member that connects the blocks to one another in series. The abnormality determination apparatus includes a first detection circuit, a closed-circuit forming unit, and a first abnormality determining unit. The first detection circuit detects a voltage of a first series circuit including the connecting member, in the plurality of blocks and the connecting member. The closed-circuit forming unit forms a closed circuit so as to allow a current to flow to the connecting member. The closed circuit includes the connecting member, at least one of the battery cells, and a diode connected in parallel to the connecting member. In two blocks of the plurality of blocks that are connected to the connecting member, the diode allows a current to flow in only a direction from a positive electrode of one of the two blocks on a low-voltage side to a negative electrode of another of the two blocks on a high-voltage side. When a charge-discharge current is not flowing to the battery pack, the first abnormality determining unit determines whether or not an open abnormality has occurred in the connecting member, based on a detection value from the first detection circuit in a state in which the closed-circuit forming unit is forming the closed circuit.

In the above-described configuration, in a state in which the closed circuit is formed, the current flows to the connecting member when an open abnormality has not occurred in the connecting member. The current flows to the diode when an open abnormality has occurred in the connecting member. As a result, when an open abnormality has not occurred in the connecting member, the detection value from the first detection circuit is a total value of the voltages of the battery cells configuring the first series circuit. However, when an open abnormality has occurred in the connecting member, the detection value from the first detection circuit is a value obtained by a forward drop voltage of the diode being subtracted from the total value of the voltages of the battery cells configuring the first series circuit. Consequently, whether or not an abnormality has occurred in the connecting member can be determined based on the detection value from the first detection circuit in a state in which the closed circuit is formed. That is, the occurrence of an open abnormality in the connecting member can be determined by a simple configuration.

In addition, the first series circuit may be configured to include none of the battery cells and includes the connecting member. In this configuration, when an open abnormality has not occurred in the connecting member, the detection value from the first detection circuit is about 0 V. When an open abnormality has occurred in the connecting member, the detection value from the first detection circuit is the forward drop voltage (negative value) of the diode.

DESCRIPTION OF THE EMBODIMENTS

Embodiments in which an abnormality determination apparatus is applied to a hybrid vehicle will hereinafter be described with reference to the drawings.

The hybrid vehicle is provided with a battery pack. The battery pack is a main-engine battery that supplies power to a motor. In addition, the motor is a motor generator that also operates as a power generator. The motor generator and the battery pack configure a power supply system of the vehicle. Between the motor generator and the battery pack, a relay switch (main relay) is provided.

Figure 1:
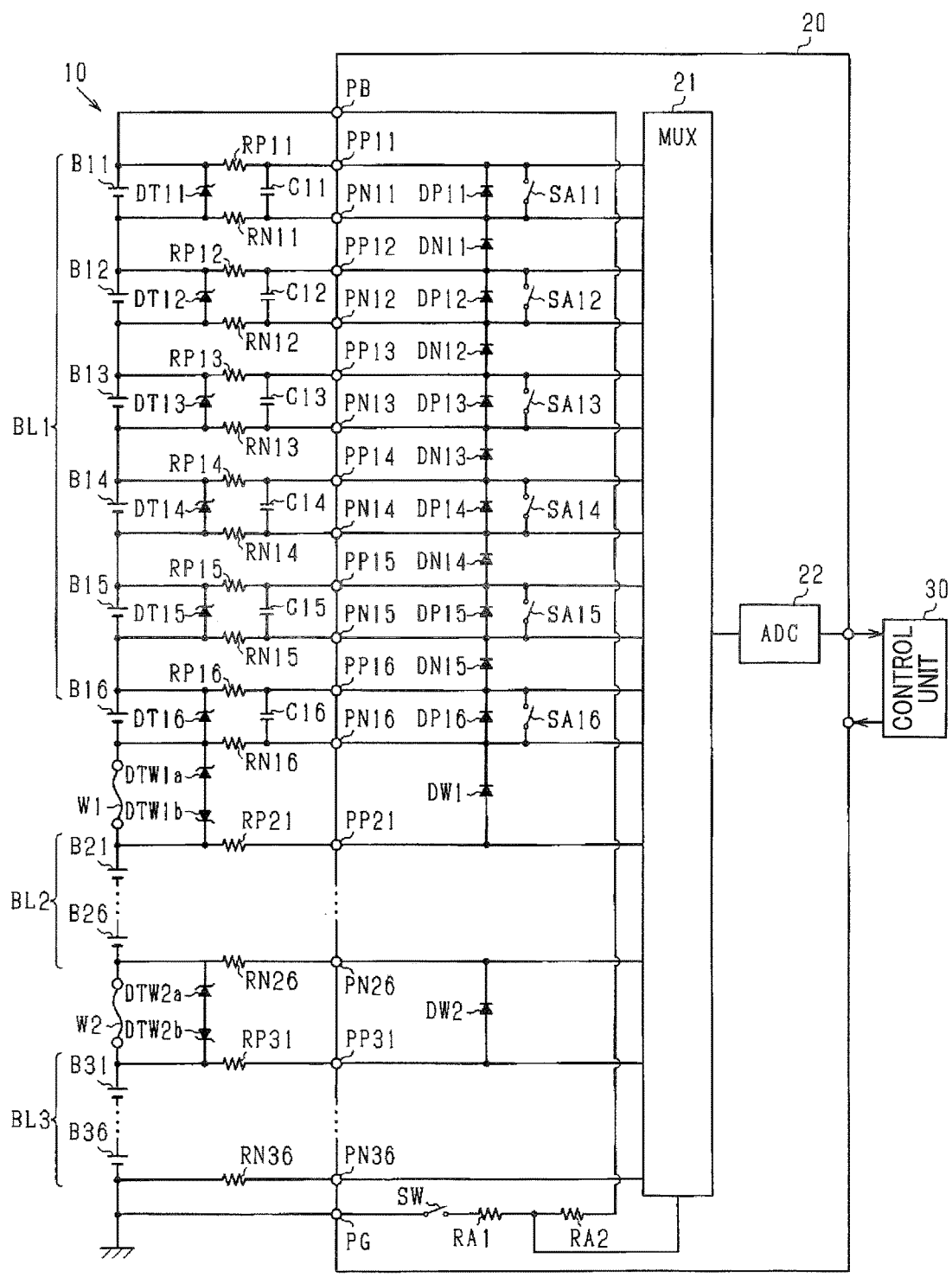
FIG. 1 is an electrical configuration diagram of a battery pack and an abnormality determination apparatus according to a present embodiment.

FIG. 1 shows an electrical configuration diagram of a battery pack 10 and an abnormality determination apparatus applied to the battery pack 10, according to the present embodiment. The abnormality determination apparatus includes a monitoring circuit 20 and a control unit 30.

The battery pack 10 is configured as a series-connection body of a plurality of battery cells B that are connected in series with one another. Each battery cell B according to the present embodiment is composed of a lithium ion secondary battery.

In the battery pack 10, the plurality of battery cells B are divided into a plurality of blocks BL1, BL2, and BL3. Here, the battery cell B is described as battery cell Bij (i=1, 2, 3; j=1 to 6). The indicator i represents the block BL1 to BL3 to which the battery cell B belongs. The indicator j represents 1, 2, 3, 4, 5, or 6, in order from the battery cell B closest to a positive electrode of the battery pack 10. Battery cells B11 to B16 belong to the block BL1. Battery cells B21 to B26 belong to the block BL2. Battery cells B31 to B36 belong to the block BL3.

The battery cells B11 to B16 that compose the block BL1 are integrally formed and configure a battery stack. Specifically, in the block BL1, a positive electrode and a negative electrode of the battery cells B11 to B16 that are adjacent to each other are connected by a bus bar. The bus bar is a bar-shaped connecting member that is composed of metal. For example, the negative electrode of the battery cell B11 and the positive electrode of the battery cell B12 are connected by the bus bar. In a manner similar to the battery cells B11 to B16 in the block BL1, the battery cells B21 to B26 that compose the block BL2 and the battery cells B31 to B36 that compose the block BL3 are also integrally formed and configure battery stacks.

In addition, a wire W1 connects a negative electrode of the block BL1 (negative electrode of the battery cell B16) and a positive electrode of the block BL2 (positive electrode of the battery cell B21). The wire W1 is a connecting member composed of metal. In a similar manner, a wire W2 connects a negative electrode of the block BL2 (negative electrode of the battery cell B26) and a positive electrode of the block BL3 (positive electrode of the battery cell B31). The wire W2 is a connecting member composed of metal. The wires W1 and W2 are connected at the time of assembly of the battery pack 10 to the vehicle.

The monitoring circuit 20 monitors the state of the battery pack 10 and is formed into an integrated circuit. Specifically, the monitoring circuit 20 detects inter-terminal voltage of each battery cell B. The monitoring circuit 20 includes terminals PPij and PNij corresponding to the battery cell Bij. The terminal PPij is connected to the positive electrode of the battery cell Bij. The terminal PNij is connected to the negative electrode of the battery cell Bij. In addition, the monitoring circuit 20 includes a multiplexer 21 (MUX) and an analog-to-digital converter 22 (ADC). The terminals PPij and PNij are connected to the ADC 22 via the MUX 21. An analog value of the voltage between the terminals selected by the MUX 21 (the voltage of the battery cell Bij) is inputted to the ADC 22.

The control unit 30 acquires the detection value of the inter-terminal voltage of each battery cell Bij from the ADC 22 of the monitoring circuit 20. Then, the control unit 30 controls a power generation operation and a regeneration operation of the motor generator, based on a charging rate (state of charge [SOC]) of each battery cell Bij, estimated from the acquired inter-terminal voltage of each battery cell Bij. In addition, the control unit 30 also performs equalizing discharge such that the SOC of the battery cells B become equal, based on the SOC of each battery cell B.

Outside of the monitoring circuit 20, a Zener diode DTij is connected between the terminal PPij and the terminal PNij. When an open abnormality occurs in the connection between the battery cells B, the Zener diode DTij suppresses the occurrence of overvoltage. Here, the open abnormality in the connection between the battery cells B occurs as a result of, for example, disconnection of the bus bar.

In addition, a bypass capacitor Cij is connected between the terminal PPij and the terminal PNij. The bypass capacitor Cij suppresses sudden fluctuations in the voltage applied between the terminal PPij and the terminal PNij that occur due to radiation noise and the like. In addition, a resistor element RPij is connected between the positive electrode of the battery cell Bij and the terminal PPij, and a resistor element RNij are connected between the negative electrode of the battery cell Bij and the terminal PNij. The resistor elements RPij and RNij and the bypass capacitor Cij function as a low-pass filter.

Inside the monitoring circuit 20, a discharge switch SAij is connected between the terminal PPij and the terminal PNij. As a result of the discharge switch SAij being set to an ON state, current flows, in order, from the positive electrode of the battery cell Bij to the resistor element RPij to the terminal PPij to the discharge switch SAij to the terminal PNij to the resistor element RNij to the negative electrode of the battery cell Bij. As a result of setting the discharge switch SAij to the ON state, the control unit 30 can discharge the battery cell Bij and reduce the SOC of the battery cell Bij to a predetermined value.

In addition, inside the monitoring circuit 20, a diode DPij is connected between the terminal PPij and the terminal PNij. A diode DNij is also connected between the terminal PNij and a terminal PPi(j+1). Respective anodes of the diodes DPij and DNij are connected to terminals on a low-voltage side. Respective cathodes of the diodes DPij and DNij are connected to terminals on a high-voltage side. For example, a diode DP11 is connected between a terminal PP11 and a terminal PN11. A diode DN11 is connected between a terminal PN11 and a terminal PN12. When an overvoltage is instantaneously applied to the terminals PPij and PNij, the diodes DPij and DNij can protect the elements configuring the monitoring circuit 20.

Outside of the monitoring circuit 20, Zener diodes DTW1*a* and DTW1*b* are connected in parallel to the wire W1. An anode of the Zener diode DTW1*a* is connected to a terminal PN16 side. A cathode of the Zener diode DTW1*a* is connected to a terminal PP21 side. An anode of the Zener diode DTW1*b* is connected to the terminal PP21 side. A cathode of the Zener diode DTW1*b* is connected to the terminal PN16 side. In a similar manner, outside of the monitoring circuit 20, Zener diodes DTW2*a* and DTW2*b* are connected in parallel to the wire W2. An anode of the Zener diode DTW2*a* is connected to a terminal PN26 side. A cathode of the Zener diode DTW2*a* is connected to a terminal PP31 side. An anode of the Zener diode DTW2*b* is connected to the terminal PP31 side. A cathode of the Zener diode DTW2*b* is connected to the terminal PN26 side. When an open abnormality occurs in the wires W1 and W2, the Zener diodes DTW1*a*, DTW1*b*, DTW2*a*, and DTW2*b* suppress the occurrence of overvoltage in the battery pack 10.

In addition, inside the monitoring circuit 20, diodes DW1 and DW2 are respectively connected in parallel to the wires W1 and W2. A cathode of the diode DW1 is connected to the negative electrode of the block BL1. An anode of the diode DW1 is connected to the positive electrode of the block BL2. Furthermore, a cathode of the diode DW2 is connected to the negative electrode of the block BL2. An anode of the diode DW2 is connected to the positive electrode of the block BL3. When an overvoltage is instantaneously applied to the terminals PN26 and PN36 in accompaniment with an open abnormality in the wires W1 and W2, the diodes DW1 and DW2 can protect the elements configuring the monitoring circuit 20.

Furthermore, the monitoring circuit 20 includes terminals PB and PG. The terminal PB is connected to the positive electrode of the block BL1. The terminal PG is connected to a negative electrode (ground potential) of the block BL3. The voltage between the terminal PB and the terminal PG is divided by resistor elements RA1 and RA2 inside the monitoring circuit 20 and subsequently inputted to the ADC 22 via the MUX 21.

The control unit 30 acquires the voltage between the terminals PB and PG from the ADC 22 in the monitoring circuit 20 as a detection value of the voltage of the overall battery pack 10 (second series circuit). In addition, a switch SW (switching element) is connected in series to the resistor elements RA1 and RA2, between the terminals PB and PG. As a result of the switch SW being set to the ON state, a closed circuit including the battery cells B11 to B36, and the wires W1 and W2, is formed. As a result of the control unit 30 outputting a command to the monitoring circuit 20 to set the switch SW to the ON state, the control unit 30 can acquire the detection value of the inter-terminal voltage of the overall battery pack 10. Here, as a result of the switch SW being set to an OFF state, the current flowing to the resistor elements RA1 and RA2 from the battery pack 10 can be stopped. Therefore, power loss can be suppressed as a result of the switch SW being provided.

The control unit 30 working as a second abnormality determining unit compares the detection value of the voltage of the overall battery pack 10 detected by the monitoring circuit 20 working as a second detection circuit, and a sum of the detection values of the voltages of the battery cells B detected by the monitoring circuit 20 working as a third detection circuit. When a difference of a predetermined value or more is determined to be present based on the result of the comparison, the control unit 30 determines than an abnormality has occurred in the detection of the voltages of the battery cells B.

Here, there is concern that an open abnormality may occur in the wires W1 and W2 as a result of misassembly and the like during assembly of the battery pack 10 to the vehicle. In addition, there is also concern that an open abnormality may occur in the wires W1 and W2 as a result of disconnection and the like while the vehicle is traveling. Therefore, the control unit 30 working as a first abnormality determining unit determines the occurrence of an open abnormality in the wires W1 and W2.

The determination made by the control unit 30 regarding the occurrence of an open abnormality in the wire W1 will be described below. The control unit 30 acquires a voltage V1 generated in the wire W1 (first series circuit) from the monitoring circuit 20. The control unit 30 then determines whether or not an open abnormality has occurred in the wire W1 based on the voltage value. The monitoring circuit 20 working as a first detection circuit detects the voltage between the terminal PN16 and the terminal PP21 in a state in which a current is flowing to the battery pack 10, as the voltage V1 generated in the wire W1.

When an open abnormality has not occurred, the voltage V1 is about 0 V because the resistance component of the wire W1 is small. Meanwhile, when an open abnormality has occurred, the current does not flow to the wire W1, but rather flows to the diode DW1. Therefore, a forward drop voltage Vf is generated in the diode DN16, and the voltage V1 becomes −Vf (about −0.6 V).

Here, when a charge-discharge current flows to the battery pack 10 in a state in which an open abnormality has occurred in the wires W1 and W2, there is concern that a large current will flow to the monitoring circuit 20 (particularly the diodes DW1 and DW2) and the Zener diodes DTW1a, DTW1b, DTW2a, and DTW2b, thereby causing damage. Therefore, the control unit 30 according to the present embodiment allows a current, which is sufficiently smaller than the charge-discharge current flowing to the battery pack 10, to flow to the wires W1 and W2 and the diodes DW1 and DW2, in a state in which the charge-discharge current is not flowing to the battery pack 10.

Specifically, the control unit 30 sets the switch SW working as a closed-circuit forming unit to the ON state in a state in which the charge-discharge current is not flowing to the battery pack 10. When the switch SW is set to the ON state, a closed circuit is formed by the battery pack 10, the resistor elements RA1 and RA2, and the switch SW. As a result of the voltages of the battery cells B configuring the battery pack 10, a current flows to the closed circuit composed of the battery pack 10, the resistor elements RA1 and RA2, and the switch SW. As a result, a current that is sufficiently smaller than the charge-discharge current flows to the wires W1 and W2 and the diodes DW1 and DW2.

The control unit 30 acquires the detection values of the voltage V1 between the terminal PN16 and the terminal PP21, and a voltage V2 between the terminal PN26 and the terminal PP31, in a state in which the switch SW is set to the ON state and the current is flowing to the wires W1 and W2 and the diodes DW1 and DW2. Then, the control unit 30 determines the occurrence of an open abnormality in the wires W1 and W2, based on the detection values.

Figure 2:
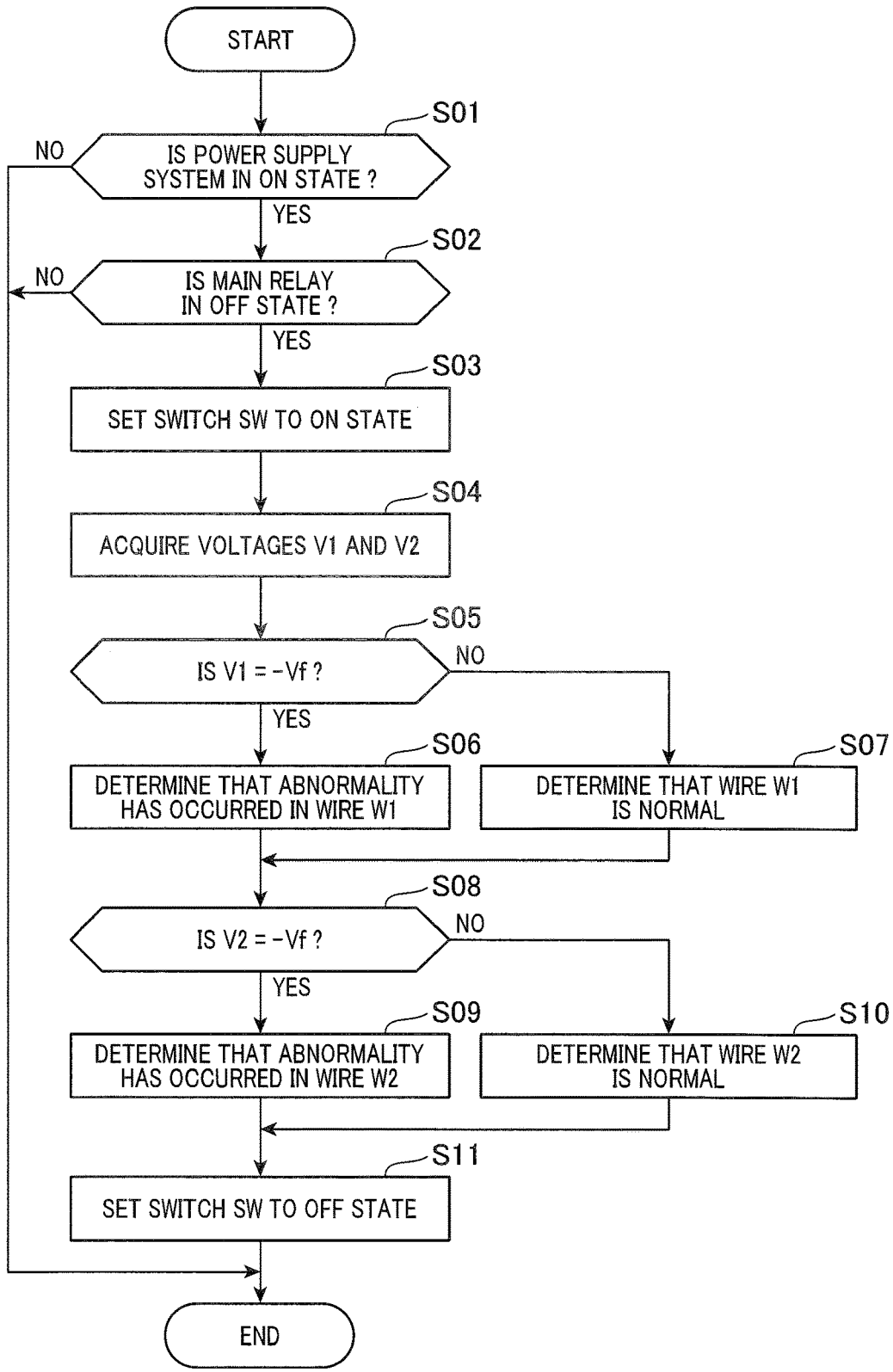
FIG. 2 is a flowchart of an abnormality determination process.

FIG. 2 shows a flowchart of an open abnormality determination process for the wires W1 and W2. The control unit 30 performs the present process at a predetermined cycle.

At step S01, the control unit 30 determines whether or not the power supply system of the vehicle is in an ON state. More specifically, the control unit 30 determines whether the power supply system is in an ignition-ON state. Next, when determined that the power supply system is in the ON state (YES at step S01), the control unit 30 determines whether or not the main relay is in the OFF state at step S02. The main relay connects and disconnects the battery pack 10 and the motor generator. When the main relay is in the OFF state, the charge-discharge current does not flow to the battery pack 10. When determined that the power supply system is set to the OFF state (NO at step S01) or the main relay is in the ON state (NO at step S02), the control unit 30 ends the process.

When determined that the main relay is in the OFF state (YES at step S02), the control unit 30 sets the switch SW to the ON state at step S03. After setting the switch SW to the ON state, the control unit 30 acquires the voltages V1 and V2 at step S04. Next, the control unit 30 determines whether or not the voltage V1 is the forward drop voltage −Vf (about −0.6 V) of the diode DW1 at step S05. The forward drop voltage −Vf is a predetermined threshold. When determined that the voltage V1 substantially matches the forward drop voltage −Vf of the diode DW1 (YES at step S05), the control unit 30 determines that an open abnormality has occurred in the wire W1 at step S06. Meanwhile, when determined that the voltage V1 is about 0 V (NO at step S05), the control unit 30 determines that an open abnormality has not occurred in the wire W1 (i.e., determines that the wire W1 is normal) at step S07.

After steps S06 and S07, the control unit 30 determines whether or not the voltage V2 is the forward drop voltage −Vf (about −0.6 V) of the diode DW2 at step S08. The forward drop voltage −Vf is a predetermined threshold. When determined that the voltage V2 substantially matches the forward drop voltage −Vf of the diode DW2 (YES at step S08), the control unit 30 determines that an open abnormality has occurred in the wire W2 at step S09. Meanwhile, when determined that the voltage V2 is about 0 V (NO at step S08), the control unit 30 determines that an open abnormality has not occurred in the wire W2 at step S10. After steps S09 and S10, the control unit 30 sets the switch SW to the OFF state and ends the process at step S11. When determined that an open abnormality has occurred in the wires W1 and W2, the control unit 30 notifies a user or the like of the abnormality.

Effects according to the present embodiment are described below.

As a result of the above-described configuration, in a state in which the closed circuit is formed, when an open abnormality has not occurred in the wires W1 and W2, the current flows to the wires W1 and W2. When an open abnormality has occurred in the wires W1 and W2, the current flows to the diodes DW1 and DW2. As a result, when an open abnormality has not occurred in the wires W1 and W2, the detection values of the voltages V1 and V2 are the total value of the voltages of the battery cells Bij configuring the first series circuit. In addition, when an open abnormality has occurred in the wires W1 and W2, the detection values of the voltages V1 and V2 are values obtained by the forward drop voltage Vf of the diodes DW1 and DW2 being subtracted from the total value of the voltages of the battery cells Bij configuring the first series circuit. Therefore, whether or not an open abnormality has occurred in the wires W1 and W2 can be determined based on the detection values of the voltages V1 and V2 in the state in which the closed circuit is formed. That is, a determination regarding the occurrence of an open abnormality in the wires W1 and W2 can be made with a simple configuration.

In addition, according to the present embodiment, the first series circuit has a configuration that includes none of the battery cells B and includes only the wires W1 and W2. As a result of the voltages V1 and V2 between the terminals connected to the wires W1 and W2 (PN16 and PP21, and PN26 and PP31) being detected, the detection values of the voltages V1 and V2 during normal operation are about 0 V (normal value). The detection values of the voltages V1 and V2 during an open abnormality are about −0.6 V (forward drop voltage Vf). Therefore, the difference in the detection values between that during normal operation and that during an open abnormality is significant. The accuracy of abnormality determination can be improved. In addition, because the voltage during normal operation is about 0 V, which is a fixed value, acquisition of the detection values (normal values) of the voltages V1 and V2 in a state in which the current is not flowing to the wires W1 and W2 and the diodes DW1 and DW2 can be omitted. The process can be simplified.

In the configuration according to the present embodiment, the monitoring circuit 20 is provided with a function (corresponding to a second detection circuit) for detecting the voltage of the battery pack 10 (corresponding to a second series circuit) that is a series-connection body of the plurality of battery cells B11 to B36 and the wires W1 and W2. In addition, the monitoring circuit 20 is provided with a function (corresponding to a third detection circuit) for detecting the respective voltages of all of the battery cells B11 to B36 configuring the battery pack 10. The control unit 30 working as the second abnormality determining unit can determine whether or not an abnormality has occurred in the third detection circuit by comparing the detection value from the second detection circuit and the total value of the detection values from the third detection circuit. More specifically, when the detection value from the second detection circuit matches the total value of the detection values from the third detection circuit, the control unit 30 determines that the third detection circuit is normal. When determined that a difference of a predetermined value or more is present between the detection value from the second detection circuit and the total value of the detection values from the third detection circuit, the control unit 30 determines that an abnormality has occurred in the third detection circuit.

Here, because the closed circuit (switch SW and resistor elements RA1 and RA2) that is used for voltage detection by the second detection circuit is also used as the closed circuit that sends a current to the wires W1 and W2 when the determination of the occurrence of an open abnormality in the wires W1 and W2 is made, the number of elements used in the monitoring circuit 20 can be reduced.

OTHER EMBODIMENTS

According to the above-described embodiment, the configuration is such that the voltage V1 between the terminal PN16 and the terminal PP21 that are connected to either end of the wire W1 is detected to determine the occurrence of an open abnormality in the wire W1. However, this configuration may be modified.

For example, the configuration may be such that the voltage between the terminals PP16 and PN21 that are connected to both ends of the series-connection body (first series circuit) of the battery cells B16 and B21 is detected to determine the occurrence of an open abnormality in the wire W1. In this configuration, in a state in which the charge-discharge current is not flowing to the battery pack 10 and the switch SW is set to the OFF state, the control unit 30 acquires the sum of the inter-terminal voltages of the battery cells B16 and B21 as the detection value of the voltage between the terminals PP16 and PN21.

In addition, in a state in which the switch SW is set to the ON state and an open abnormality has not occurred in the wire W1, the control unit 30 acquires the sum of the inter-terminal voltages of the battery cells B16 and B21 as the detection value of the voltage between the terminals PP16 and PN21. Furthermore, in a state in which the switch SW is set to the ON state and an open abnormality has occurred in the wire W1, the control unit 30 acquires a value obtained by the forward drop voltage Vf of the diode DW1 being subtracted from the sum of the inter-terminal voltages of the battery cells B16 and B21 as the detection value of the voltage between the terminals PP16 and PN21.

Here, when the charge-discharge current is not flowing to the battery pack 10, the control unit 30 serving as the first abnormality determining unit acquires the detection value of the voltage between the terminals PP16 and PN21 in a state in which the switch SW is set to the OFF state. Moreover, when the charge-discharge current is not flowing to the battery pack 10, the control unit 30 sets the switch SW to the ON state, and acquires the detection value of the voltage between the terminals PP16 and PN21 in the state in which the switch SW is set to the ON state.

The control unit 30 can then determine the occurrence of an open abnormality in the wire W1 based on a comparison between the detection value of the voltage acquired when the switch SW is set to the OFF state and the detection value of the voltage acquired when the switch SW is set to the ON state.

Specifically, when the detection value of the voltage acquired when the switch SW is set to the ON state does not change from the detection value of the voltage acquired when the switch SW is set to the OFF state, the control unit 30 determines that an open abnormality has not occurred. In addition, when the detection value of the voltage acquired when the switch SW is set to the ON state has decreased by the forward drop voltage Vf from the detection value of the voltage acquired when the switch SW is set to the OFF state, the control unit 30 determines that an open abnormality has occurred. In this way, the determination of the occurrence of an open abnormality can be made based on the voltage of the series-connection body including the wire W1 and the battery cells B.

In addition, for example, to determine whether or not an open abnormality has occurred in at least either of the wire W1 and the wire W2, the configuration may be such that the detection value of the overall battery pack 10, that is, the voltage between the terminal PB and the terminal PG, is used.

When the charge-discharge current is not flowing to the battery pack 10, the control unit 30 serving as the first abnormality determining unit acquires the detection value of the voltage between the terminals PB and PG in a state in which the switch SW is set to the OFF state. In addition, when the charge-discharge current is not flowing to the battery pack 10, the control unit 30 sets the switch SW to the ON state, and acquires the detection value of the voltage between the terminals PB and PG in the state in which the switch SW is set to the ON state.

The control unit 30 can determine the occurrence of an open abnormality in at least either of the wire W1 and the wire W2 based on a comparison between the detection value of the voltage acquired when the switch SW is set to the OFF state and the detection value of the voltage acquired when the switch SW is set to the ON state.

Specifically, when the detection value of the voltage acquired when the switch SW is set to the ON state does not change from the detection value of the voltage acquired when the switch SW is set to the OFF state, the control unit 30 determines that an open abnormality has not occurred in both wires W1 and W2 (i.e., neither the wire W1 nor the wire W2 has an open abnormality). In addition, when the detection value of the voltage acquired when the switch SW is set to the ON state has decreased by the forward drop voltage Vf from the detection value of the voltage acquired when the switch SW is set to the OFF state, the control unit 30 determines that an open abnormality has occurred in either of the wires W1 and W2. In this way, the determination of the occurrence of an open abnormality in at least either of the wires W1 and W2 can be made based on the voltage of the overall battery pack 10.

That is, the first series circuit that uses the inter-terminal voltage to determine the occurrence of an open abnormality may be configured to include the plurality of wires W1 and W2. As a result of such a configuration, the occurrence of an abnormality in the plurality of wires W1 and W2 can be determined by a simple process.

According to the above-described embodiment, to determine the occurrence of an open abnormality in the wire W1, the configuration is such that the switch SW used to detect the voltage of the overall battery pack 10 is set to the ON state. However, the configuration may be modified.

Figure 3:
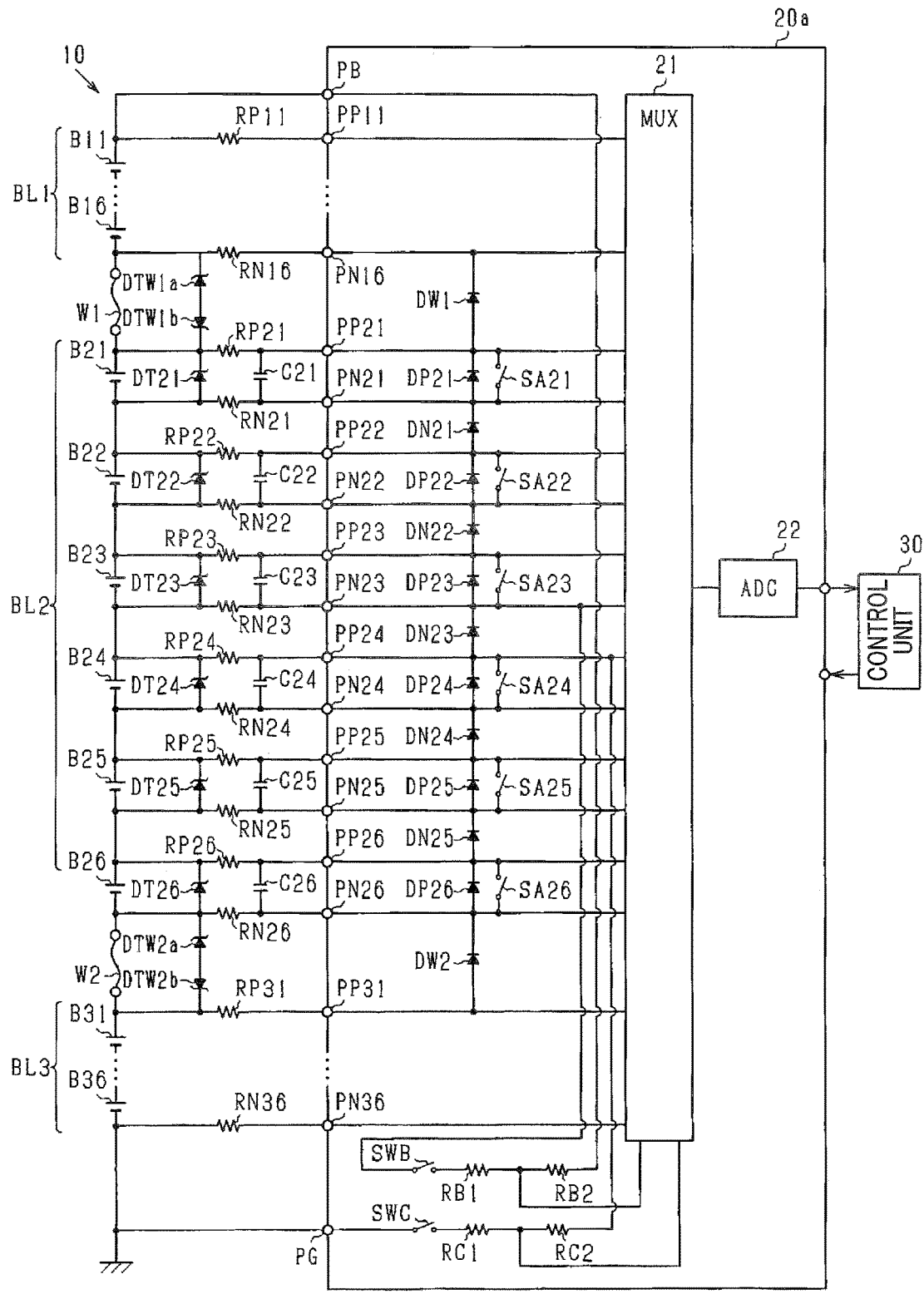
FIG. 3 is an electrical configuration diagram of the battery pack and the abnormality determination apparatus in a variation example.

For example, as shown in FIG. 3, the configuration may be such that a switch SWB and a switch SWC are provided. The switch SWB is provided for the detection of the voltage of a series-connection body (corresponding to a second series circuit) composed of the battery cells B11 to B23. The switch SWC is provided for the detection of the voltage of a series-connection body (second series circuit) composed of the battery cells B24 to B36. As a result of the switch SWB being set to the ON state, the voltage divided by resistor elements RB1 and RB2 is inputted to the MUX 21. In addition, as a result of the switch SWC being set to the ON state, the voltage divided by resistor elements RC1 and RC2 is inputted to the MUX 21.

In this case, as a result of the switch SWB being set to the ON state, a closed circuit including the battery cells B11 to B23, the wire W1, and the diode DW1 is formed. As a result of the voltages of the battery cells B11 to B23, a current flows to the wire W1 and the diode DW1.

Therefore, the occurrence of an open abnormality in the wire W1 can be determined by the switch SWB being set to the ON state. In a similar manner, the occurrence of an open abnormality in the wire W1 can be determined by the switch SWC being set to the ON state.

As described above, to determine the occurrence of an open abnormality in the wire W1, all that is required is that a closed circuit in which the current flows to the wire W1 and the diode DW1 be formed. Therefore, for example, the configuration may be such that a switch that forms a closed circuit including the wire W1 and the battery cell B16 is provided. In a similar manner, the configuration may be such that a switch that forms a closed circuit including the wire W2 and the battery cell B26 is provided.

A nickel-metal hydride secondary battery or the like may be used as the battery cell, instead of the lithium ion secondary battery. In addition, a fuel cell or the like may be used as the battery cell, instead of the secondary battery.

According to the above-described embodiment, the configuration is such that the monitoring circuit 20 and the control unit 30 are separately provided. However, the configuration may be modified such that the monitoring circuit and the control unit are integrally provided. For example, the monitoring circuit may include the control unit.

A bus bar that is a bar-shaped member composed of metal, a metal plate, or the like may be used as the connecting member for connecting the blocks to one another in series, instead of the wires W1 and W2 according to the above-described embodiment.

According to the above-described embodiment, the configuration is such that an open abnormality is determined to have occurred when the voltages V1 and V2 are identical to the forward drop voltage Vf of the diodes DW1 and DW2, which is a predetermined threshold. However, the configuration may be modified. An open abnormality may be determined to have occurred in the wires W1 and W2 when the difference between detection values of the voltages V1 and V2 when the switch SW is set to the ON state and the normal value (0 V) is equal to or greater than a predetermined threshold (such as Vf/2) set based on the forward drop voltage Vf.

What is claimed is:

1. An abnormality determination apparatus that is applied to a battery pack including a plurality of blocks composed of a plurality of battery cells that are connected in series, and a connecting member that connects the plurality of blocks to one another in series, the abnormality determination apparatus comprising:
    a first detection circuit that detects a voltage between terminals of a first path that does not include the plurality of the battery cells and that does include the connecting member;
    a diode connected in parallel to the connecting member and in two blocks of the plurality of blocks that are connected to the connecting member, the diode allowing a current to flow in only a direction from a positive electrode of one of the two blocks on a low-voltage side to a negative electrode of another of the two blocks on a high-voltage side;
    a closed-circuit forming unit that forms a closed circuit so as to allow a current to flow to the connecting member, the closed circuit including the connecting member and at least one of the battery cells, the closed-circuit forming unit including a switching element that is configured to be turned on so as to form the closed circuit when a charge-discharge current is not flowing to the battery pack and to be turned off so as not to form the closed circuit when the charge-discharge current is flowing to the battery pack; and a first abnormality determining unit that, when a charge-discharge current is not flowing to the battery pack, determines whether an open abnormality has occurred in the connecting member, based on a detection value from the first detection circuit in a state in which the closed-circuit forming unit is forming the closed circuit.

2. The abnormality detection apparatus according to claim 1, wherein:

the first abnormality determining unit determines that an open abnormality has occurred in the connecting member when a difference between the detection value from the first detection circuit and a normal value is a predetermined threshold or greater.

3. The abnormality detection apparatus according to claim 2, wherein: the predetermined threshold is set based on a forward drop voltage of the diode.

4. The abnormality determination apparatus according to claim 3, wherein:

the closed circuit includes a resistor element and the switching element configuring the closed-circuit forming unit, the resistor element and the switching element being connected between a positive electrode and a negative electrode of a second path including the first path and the plurality of battery cells, the closed circuit being formed by the switching element being set to an ON state; and the abnormality determination apparatus includes
a second detection circuit that detects a voltage between terminals of the second path based on a voltage generated in the resistor element when the switching element is set to the ON state,
a third detection circuit that detects respective voltages of all battery cells configuring the second path, and
a second abnormality determining unit that determines whether an abnormality has occurred in the third detection circuit by comparing the detection value from the second detection circuit and a total value of the detection values from the third detection circuit.

5. The abnormality determination apparatus according to claim 1, wherein:

the closed circuit includes a resistor element and the switching element configuring the closed-circuit forming unit, the resistor element and the switching element being connected between a positive electrode and a negative electrode of a second path including the first path and the plurality of battery cells, the closed circuit being formed by the switching element being set to an ON state; and the abnormality determination apparatus includes
a second detection circuit that detects a voltage between terminals of the second path based on a voltage generated in the resistor element when the switching element is set to the ON state,
a third detection circuit that detects respective voltages of all battery cells configuring the second path, and
a second abnormality determining unit that determines whether an abnormality has occurred in the third detection circuit by comparing the detection value from the second detection circuit and a total value of the detection values from the third detection circuit.

6. A battery pack comprising:
a plurality of blocks composed of a plurality of battery cells that are connected in series;
a connecting member that connects the plurality of blocks to one another in series; and
an abnormality determination apparatus comprising:
a first detection circuit that detects a voltage between terminals of a first path that does not include the plurality of battery cells and that includes the connecting member,
a diode connected in parallel to the connecting member and in two blocks of the plurality of blocks that are connected to the connecting member, the diode allowing a current to flow in only a direction from a positive electrode of one of the two blocks on a low-voltage side to a negative electrode of another of the two blocks on a high-voltage side;
a closed-circuit forming unit that forms a closed circuit so as to allow a current to flow to the connecting member, the closed circuit including the connecting member and at least one of the battery cells, the closed-circuit forming unit including a switching element that is configured to be turned on so as to form the closed circuit when a charge-discharge current is not flowing to the battery pack and to be turned off so as not to form the closed circuit when the charge-discharge current is flowing to the battery pack; and
a first abnormality determining unit that, when a charge-discharge current is not flowing to the battery pack, determines whether an open abnormality has occurred in the connecting member, based on a detection value from the first detection circuit in a state in which the closed-circuit forming unit is forming the closed circuit.

7. An abnormality determination method for a battery pack including a plurality of blocks composed of a plurality of battery cells that are connected in series, and a connecting member that connects the plurality of blocks to one another in series, the abnormality determination method comprising:
detecting, by a first detection circuit, a voltage between terminals of a first path that does not include the plurality of the battery cells and that does include the connecting member,
utilizing a diode connected in parallel to the connecting member and in two blocks of the plurality of blocks that are connected to the connecting member, the diode allowing a current to flow in only a direction from a positive electrode of one of the two blocks on a low-voltage side to a negative electrode of another of the two blocks on a high-voltage side;
forming, by a closed-circuit forming unit, a closed circuit so as to allow a current to flow to the connecting member, the closed circuit including the connecting member and at least one of the battery cells, the closed-circuit forming unit including a switching element that is configured to be turned on so as to form the closed circuit when a charge-discharge current is not flowing to the battery pack and to be turned off so as not to form the closed circuit when the charge-discharge current is flowing to the battery pack; and
when a charge-discharge current is not flowing to the battery pack, determining whether an open abnormality has occurred in the connecting member, based on a detection value from the first detection circuit in a state in which the closed-circuit forming unit is forming the closed circuit.

* * * * *